United States Patent
Eberspacher et al.

(10) Patent No.: US 6,821,559 B2
(45) Date of Patent: Nov. 23, 2004

(54) METHOD OF FORMING PARTICULATE MATERIALS FOR THIN-FILM SOLAR CELLS

(76) Inventors: Chris Eberspacher, 2300 Alice Ann Rd., Newbury Park, CA (US) 91320; Karen Lea Pauls, 2300 Alice Ann Rd., Newbury Park, CA (US) 91320

( * ) Notice: Subject to any disclaimer, the term of this patent is extended or adjusted under 35 U.S.C. 154(b) by 140 days.

(21) Appl. No.: 09/898,823

(22) Filed: Jul. 3, 2001

(65) Prior Publication Data

US 2002/0006470 A1 Jan. 17, 2002

Related U.S. Application Data

(62) Division of application No. 08/942,872, filed on Oct. 2, 1997, now Pat. No. 6,268,014.

(51) Int. Cl.$^7$ .................................................. B05D 3/02
(52) U.S. Cl. ...................... 427/226; 427/227; 427/229; 427/383.1
(58) Field of Search ................................ 427/216, 217, 427/212, 215, 226, 227, 229, 383.1; 75/355, 256

(56) References Cited

U.S. PATENT DOCUMENTS

| | | | | | |
|---|---|---|---|---|---|
| 4,023,961 A | * | 5/1977 | Douglas et al. | ................ | 75/355 |
| 4,173,518 A | * | 11/1979 | Yamada et al. | ............. | 205/384 |
| 4,396,420 A | * | 8/1983 | Schmidberger et al. | ........ | 75/355 |
| 4,624,941 A | * | 11/1986 | Berndt et al. | ................ | 502/302 |
| 5,919,727 A | * | 7/1999 | Brezny | ........................ | 502/304 |
| 5,928,405 A | * | 7/1999 | Ranade et al. | ................. | 75/337 |
| 5,964,918 A | * | 10/1999 | Asada et al. | ................... | 75/351 |

FOREIGN PATENT DOCUMENTS

EP            297799       *  1/1989

* cited by examiner

*Primary Examiner*—Elena Tsoy (57) ABSTRACT

A method for preparing particulate materials useful in fabricating thin-film solar cells is disclosed. Particulate materials is prepared by the method include for example materials comprising copper and indium and/or gallium in the form of single-phase, mixed-metal oxide particulates; multiphase, mixed-metal particulates comprising a metal oxide; and multinary metal particulates.

11 Claims, 3 Drawing Sheets

METHOD OF FORMING PARTICULATE MATERIALS FOR THIN-FILM SOLAR CELLS

CROSS-REFERENCE OF RELATED APPLICATIONS

This is a division of Ser. No. 08/942,872 filed Oct. 2, 1997 now U.S. Pat. No. 6,268,014.

STATEMENT REGARDING FEDERALLY SPONSORED RESEARCH OR DEVELOPMENT

This invention was made with Government support under Grant No. DE-FG03-96ER82300 awarded by the Department of Energy. The Government has certain rights in this invention.

BACKGROUND OF THE INVENTION

The present invention generally relates to the formation of materials useful for electronic applications, in particular for photovoltaic solar cells.

Manufacturers of electronic devices, in particular photoelectronic devices and more specifically photovoltaic devices, are increasingly employing non-elemental materials such as III–V, II–VI and I–III–VI semiconductors and alloys, mixtures and layered structures of such materials. The constituent layers in such photoelectronic devices are typically fabricated using vapor phase deposition processes such as vacuum evaporation, sputtering and chemical vapor deposition. Vapor phase processes are useful for small-scale research and for high-precision processing of high-value, small-area devices such as integrated circuits. Vapor phase processes have yielded solar cells with high sunlight-to-electricity conversion efficiencies; but it is difficult to deposit uniform films on large areas using coincident vapor phase processes in which the constituent elements are co-deposited, hence coincident vapor phase processes are typically costly to scale up to large device sizes with the control and through-put required for commercial production.

Various researchers have explored sequential vapor phase processes. $CuInSe_2$ films are typically formed by sequentially depositing solid layers of Cu and In elemental metals and subsequently reacting the Cu—In composite layers with a source of Se to form $CuInSe_2$. By solid layer we mean a substantially solid layer of material with minimal included void space. Multi-step, sequential processes substitute separate sequential deposition of constituents in place of co-deposition of constituents, with the intent of mitigating materials interactions that typically complicate co-deposition processes. However, this separation into sequential depositions of different constituents can introduce new complications; for example, vapor phase deposited indium tends to de-wet, forming localized islands, and solid layers of Cu—In alloys can segregate into In-rich and Cu-rich phases when heated, with the result that extreme care is required to maintain the desired planar Cu—In layer structure and lateral composition uniformity during the early stages of subsequent reactions to form $CuInSe_2$.

Various researchers have explored techniques for stabilizing metal precursor layers such as Cu—In for $CuInSe_2$ against de-wetting and phase segregation. For example, thin layers of a chalcogenide metal such as tellurium can be deposited on the substrate prior to the deposition of Cu and In in order to form telluride compounds that mitigate indium de-wetting and phase segregation, and solid layers of binary chalcogenide compounds such as $Cu_2Se$ and $In_2Se_3$ can be deposited and subsequently interdiffused to form ternary $CuInSe_2$. Such processes use chalcogenide compounds to stabilize the primary non-chalcogen constituent metals Cu and In against phase segregation during deposition and subsequent processing.

Other researchers have explored vapor phase processing of oxide-containing phase-stabilized precursors and mixtures of such precursors with elemental metals and non-oxide chalcogenides. For example, chalcogenide solid films can be formed by depositing a metal oxide solid film and annealing the oxide film in a gas or vapor containing a metal chalcogen such as S, Se, Te or a mixture thereof. Such processes can also utilize layers of single-phase oxide particulates, such as $Cu_2In_2O_5$ particles or such as $Cu_2O$ particles mixed with $In_2O_3$ particles, and can also utilize solid layers of a mixture of metal and oxide, selenide or sulfide compound constituents. While mitigating certain complications of sequential processes, these phase-stabilized precursor improvements leave unresolved the inherent complexities of achieving the constituent layer uniformity necessary to achieve high-quality semiconductor films using vapor phase processes.

Various researchers have explored alternatives to vapor phase processes for fabricating semiconductor materials for various photoelectronic applications. Electrodeposition can be used to sequentially deposit solid layers of constituent metals such as Cu and In that are subsequently reacted with chalcogenide metals such as Se to form compound semiconductor films. The chalcogenide metal can be embedded in the electroplated solid metal layers by adding Se particles to the electroplating bath so as to incorporate Se particles into one or more of the metallic layers. Additional Se can be added by screen printing a solid Se layer on the Cu—In—Se precursor layers, or by annealing the electrodeposited layers in Se vapor. While avoiding some of the disadvantages of vapor phase processes, such electrodeposition processes are plagued with the challenges of uniform high-rate electrodeposition on large-area substrates and introduce electrodeposition-specific complications such as metal-contaminated waste treatment, recovery and disposal.

Other researchers have explored alternatives to both vapor phase and electrodeposition processes. For example, spray pyrolysis techniques can be used to deposit metal oxide solid layers, and the oxide layers can subsequently be annealed in chalcogenide metal vapor to convert the oxide layers to chalcogenide films. Spray pyrolysis is convenient for depositing multi-component oxides on large areas; but the materials use efficiencies of spray pyrolysis processes are generally low, hence manufacturing materials costs are generally high.

Alternatively, one can form precursor layers by screen printing a paste of particles or by painting a substrate with a slurry of particles. For example, one can form a Cu—In—Se powder, prepare a paste from the powder, screen print layers of the paste, and anneal the layers to form $CuInSe_2$ films. Cu—In—Se powders prepared by ball milling or grinding reportedly yield median particle diameters of 1.5 $\mu$m and larger. Median powder particle diameter determines minimum pinhole-free $CuInSe_2$ layer thickness; particle diameters of 1.5–2 $\mu$m typically limit $CuInSe_2$ film thickness to 5 $\mu$m or greater. Such film thickness are a factor of 5–10 thicker than necessary to absorb incident sunlight, and result in high manufacturing materials costs. Researchers preparing $CuInSe_2$ films by screen printing and sintering $CuInSe_2$-based pastes report taking particular measures to avoid the formation of indium oxides deleterious to the $CuInSe_2$ film properties. Screen-printed films are typically much thicker than required to absorb sunlight sufficiently. Screen printing and related film formation processes are unlikely to be economic unless effective strategies for forming powders with smaller particle diameters and for processing the powders to achieve good film quality are developed.

Various researchers have investigated small particles with median particle diameters of 100 nm and less as a pathway to preparing thin-film materials. Nanoparticles of a wide range of oxides (e.g. ZnO, $SnO_2$, $WO_3$, etc.) and chalcogenides (e.g. CdS, CdTe, etc.) have been reported, and thin films have been formed from nanoparticles by a variety of techniques. Such small particles can be deposited as particulate layers by a variety of processes including, for example, electrophoresis of colloidal suspensions and slurry spraying. $CuInSe_2$ films have been prepared by spraying slurries of mixtures of single-phase, binary selenide nanoparticles such as $Cu_xSe$ and $In_xSe$, but film quality and device performance are poor due to insufficient interparticle diffusion. This implies that small median chalcogenide particle diameters alone do not provide improved particle-based thin film properties.

The use of an effective flux is known to be particularly important for promoting particle coalescence and grain growth in particle-based thin films. $CdCl_2$ works well as a flux with Cd-based chalcogenide materials such as CdTe and Cd(Se,Te). A comparable flux has not been reported for $CuInSe_2$ and related alloys. Se, CuCl, $InCl_3$ and Cu—Se compounds have been evaluated as fluxes for screen-printed $CuInSe_2$ layers, and non-negligible fluxing reportedly occurs only at relatively high temperatures in Cu-rich material when a liquid $Cu_2Se$ is present. Thus effective fluxing of $CuInSe_2$ is possible only under conditions that result in Cu-rich $CuInSe_2$ films unsuitable for solar cells, or in complex multi-step processes such as continuous co-evaporation in which the growing $CuInSe_2$ film is temporarily made Cu-rich to effect transient fluxing via liquid $Cu_2Se$ before differentially adding In and Se to achieve an In-rich final film composition. Results are also poor when paste mixtures of Cu and In elemental powders are screen printed and overcoated with screen-printed Se powder paste.

Summarizing the prior art, coincident vapor phase processes are difficult to control on large areas; sequential vapor phase processes simplify some of the complexities, but composition uniformity and precursor phase segregation can be severe problems. Metal oxides are useful as phase-stabilized precursors, but uniform, high-rate, vapor phase deposition of oxide solid films is difficult, and spray pyrolysis of oxide solid films is inefficient due to poor materials use efficiencies. Particulate-based processes such as screen printing can have high materials efficiencies, but such processes generally work well only when efficient fluxing processes are available. A clear need exists for phase-stabilized precursors that can be easily converted to thin-film, photovoltaic materials. A need also exists for an easily controlled process for forming such precursors. It would be especially advantageous to provide a process using particulate precursors to fabricate thin films with well-controlled compositions on large areas, as well as materials and processing techniques for creating high quality, thin film products without contamination from residual flux materials.

BRIEF SUMMARY OF THE INVENTION

The present invention provides unique methods for making phase-stabilized precursors in the form of fine particles, such as sub-micron multinary metal particles, and multi-phase mixed-metal particles comprising at least one metal oxide.

The invention further provides methods of using spraying and coating techniques to deposit thin, close-packed layers of multinary metal and/or mixed-metal metal oxide particles. In one embodiment slurry spraying is used to deposit layers of single-phase, mixed-metal oxide particulates from aqueous slurries sprayed in air on a heated substrate.

In one aspect of the invention, compound materials are formed using precursors comprising multi-phase particles comprising a metal oxide phase. In one embodiment, particulate precursors are deposited as layers on suitable substrates by efficient processes such as slurry spraying. The precursor layers are then converted to useful films by reacting precursor layer components together so as to cause interdiffusion, and/or by reacting the precursor layers with other reactant materials, such as overcoated layers, liquids, vapors or gases, causing ion exchange and interdiffusion. Of particular advantage are multi-phase particles in which each particle contains more than one compositional phase; multi-phase particulate precursors comprising metal oxides yield superior final film characteristics relative to single-phase metal oxide particulate precursors or precursors made up exclusively of non-oxide compound particles.

In another aspect of the invention, the precursors are multi-phase particles comprising both a metal oxide phase and a non-oxide phase. The presence of a non-oxide phase provides advantageous reaction pathways for converting particulate precursor materials to high-quality final materials by, for example, facilitating transient fluxing by intermediate phases during the conversion process. Of particular advantage are multi-phase particles comprising a metal oxide and a metal phase or binary compound phase in which the metal or compound phase facilitates fluxing and densification by forming liquid phases that facilitate transient fluxing between precursor particles during the conversion of the precursor to the final material. The differing conversion rates of the multiple phases of the precursor particles provides a pathway for transient fluxing due to a localized relative abundance of one or more constituents in a precursor material that has an overall deficiency of those constituents.

In another aspect of the invention, multinary metallic particles and mixtures of multinary metallic particles are used as precursors to further augment the advantages of particles comprising non-oxide phases, and to further simplify the conversion of precursor materials to desirable final materials. Of particular advantage are multinary, metallic particles that allow films of mixed-metal compounds to be prepared without the phase segregation problems typically associated with annealing solid mixed-metal layers.

In another aspect of the invention, there are provided methods for forming porous precursor layers intercalated with other materials, thereby further simplifying the conversion reactions of precursor layers to final films and further improving the density and electronic quality of the final films. Intercalation reduces the void space within a particulate-based layer and facilitates solid state reactions to form dense, coherent films. Intercalation provides pathways to facilitate transient localized fluxing in precursor layers that, through interdiffusion, reach efficient final film composition.

The present invention provides methods for making multi-phase mixed-metal particles comprising at least one metal oxide, and methods for making multinary metal particles. The invention teaches the use of slurry spraying, spray printing, spin coating and meniscus coating to deposit layers of particulate materials. The invention exploits the heretofore unrecognized advantages of using multi-phase particles as precursor materials for forming many desirable materials. In particular, the invention provides a route to thin-film materials using unique precursors such as metal oxide phases, non-oxide phases, and metallic phases. The invention further teaches that the utility of all kinds of particulate precursors can be augmented by intercalating the particles with other useful materials so as to facilitate low-temperature, solid-state ion exchange and densification. The full spectrum of unique advantages of this invention are more completely evident in the embodiments below.

BRIEF DESCRIPTION OF THE DRAWINGS

Further aspects and details of the invention will become apparent when considered in conjunction with the attached drawings, wherein.

DETAILED DESCRIPTION OF THE INVENTION

Throughout the text, the following definitions are used:
materials—bulk forms, such as free-standing solids or particles, or film forms, such as coatings, layers, or films on a substrate.
compound—comprising two or more chemically-bonded elements.
particulate—solid-state, granular pieces; not liquid droplets.
precursor
materials—source materials in intermediate bulk or film form that can be subsequently converted to a final desired material.
phase—a constituent region of specific composition.
multi-phase—containing more than one phase.
mixed-metal—containing two or more metals.
metal oxide—a compound comprising oxygen and at least one metal.
non-oxide—a chemical moiety substantially devoid of oxygen; or, a chemical moiety in which oxygen is present only as part of a multi-element ion.
multinary—containing two or more elements.
metallic—consisting of elemental metals, metalloids, or alloys of elemental metals and/or metalloids, such that the resulting phases(s) is(are) not multinary compound(s). "Metallic" includes, for example, homogeneous particles of a single-phase alloy of Cu and In; multi-phase particles containing for example, separate Cu, In and Cu—In alloy phases; and multi-phase particles containing Cu, In, and Se as metals and/or alloys. Excluded are precursors containing stable compounds, such as $Cu_xSe$, $In_xSe$ and $Cu_xIn_ySe$, other than de minimis interdiffused layers that may exist, for example, at the interface between a Cu—In metal phase and an adjacent Se metal phase.

The present invention provides processes for forming unique precursor particulate materials, and compound materials made from such precursor materials. The preferred embodiments of this invention are clearly demonstrated in the case of the preparation and processing of $CuInSe_2$ and related alloys, and relevant illustrative examples are for the most part given below relative to $CuInSe_2$, its alloys with Ga and S, and desirable additives such as Na. The considerable advantages of this invention are, however, not limited to these materials; rather, the improvements embodied in this invention are useful for a wide range of bulk and film materials, including but not limited to I–III–VI, II–VI, III–VI, III–V, and II–IV–V compounds and various alloys and dopants of these.

In a first aspect of the invention, a method is provided for making fine particles, such as sub-micron, mixed-metal particles comprising a metal oxide phase or both a metal oxide phase and a non-oxide phase. This first aspect also provides a method for making fine metallic particles, such as sub-micron, multinary, metallic particles.

Particulate materials can be prepared by numerous methods, including laser pyrolysis, atmospheric arc evaporation, solution precipitation, chemical vapor reactions, aerosol pyrolysis, vapor condensation, laser ablation and other such methods as known in the art. Aerosol pyrolysis is particularly useful for low-cost production of mixed-metal particulates comprising metal oxides, and multinary metallic particulates, in particular, substantially solid, substantially spherical particulates. Aerosol pyrolysis is also useful for adding additional desirable constituents such as dopants and alloying elements, such as Ga in $CuInSe_2$, and desirable additives, such as Na, in $CuInSe_2$ and its alloys.

Aerosol pyrolysis processes can be used to form very fine sized powders of metal oxide materials by atomizing metal salt solutions into fine mist droplets and pyrolyzing the droplets to particles in a suitable environment. Metal oxide powders can be subsequently reduced to metallic powders by annealing in suitably reducing circumstances, such as in an atmosphere comprising $H_2$ gas. Metallic powders can be directly produced by aerosol pyrolysis by proper selection of solution composition and reducing reaction environment. Hybrid aerosol pyrolysis processes in which particles suspended in droplets of a salt solution are pyrolyzed to form composite particles are particularly suitable for making multi-phase, composite particles where an oxide phase is present with a non-oxide phase such as a metal or non-oxide chalcogenide phase, and where one or more phases substantially envelop one or more other phases.

In one embodiment, this first aspect of the invention comprises atomizing source materials and introducing the atomized source materials into an environment where they react to form multi-phase, mixed-metal particles. Suitable source materials include, without limitation, solutions for spray pyrolysis as known in the art, including for example solutions comprising one or more dissolved metals and/or metal-containing compounds. A particularly useful solution is an aqueous solution of metal salts, such as nitrates, sulfates and halides, more preferably aqueous solutions of two or more metal nitrates in concentrations of about 0.01–1000 mull-Molar, more preferably about 0.1–10 milli-Molar. Other source materials include mixed-metal solids, such as alloy wires or powders usable as source materials for flame spraying, plasma gun atomization and other methods that create molten metal droplets or metal vapors. Source materials according to this first embodiment are mixed-metal materials comprising two or more metals in atomic ratios necessary to yield the desired composition of the final particulate materials.

Source materials can be atomized by various means, including for example, ultrasonic nebulizers, electrostatic nebulizers, pneumatic nebulizers, spinning wheel atomizers, impact atomizers and other such methods as known in the art. Ultrasonic nebulizers operating at frequencies above 1 MHz are particularly advantageous for producing source solution aerosols with 0.35–10 micron diameter droplets.

Suitable environments for reacting source materials to form multi-phase mixed-metal particles according to this first embodiment include environments in which a source of energy is present to drive the reaction of source materials to final particulate materials. Such energetic environments include, for example, near-atmospheric-pressure furnaces, vacuum furnaces, microwave furnaces and other such environments as known in the art and capable of heating a material therein. A suitable environment according to this first embodiment is one capable a heating the atomized source materials to a temperature and for a time sufficient for the source materials to react to form the desired final multinary material. Alternatively, if the source material is atomized in such as way as to be inherently highly energetic, such as by being atomized as a molten metal or metal vapor, then the reaction environment need not add any additional energy to the atomized source material. Suitable reaction environments according to this first embodiment include gaseous environments where the ambient pressures are at absolute pressures above, below, or near atmospheric pressure, such as the environment produced in a high-pressure autoclave, a vacuum furnace, and a quartz tube furnace, respectively. A near-atmospheric-pressure, flowing-gas furnace operating at 350°–1050° C. and operated so as to allow 3 or more seconds residence time of sources and reactants in the hot zone is particularly advantageous as a reaction environment for atomized aqueous source solutions.

Suitable ambient gases include oxidizing gases, such as oxygen and air; substantially inert gases such as nitrogen and noble gases; and reducing gases such as hydrogen, hydrogen mixed with inert gases (for example, nitrogen), and hydride gases such as $H_2Se$, $H_2S$, etc. Oxidizing ambient gases are particularly advantageous for making oxide final materials; for example, oxygen is advantageous in making single-phase $Cu_2In_2O_5$ particles. Inert ambient gases are particularly advantageous for making multi-phase materials comprising a metal oxide; for example, nitrogen is advantageously employed for reacting aqueous nitrate solutions to make multi-phase $Cu_2O$—$In_2O_3$ particles in which each particle has localized regions of $Cu_2O$ and $In_2O_3$. Reducing ambient gases are particularly advantageous for making multi-phase materials comprising a metal phase or comprising metal oxide phase and a non-oxide phase; for example, 10 vol % $H_2$ in $N_2$ is particularly advantageous for reacting aqueous nitrate solutions to make Cu—$In_2O_3$ metal-metal oxide particulate sources in which each particle comprises a metallic Cu phase and an $In_2O_3$ oxide phase.

Source materials, ambient gas, and reaction energetics must be controlled to achieve multi-phase particles. For example, single-phase particles of CuO, $Cu_2O$ and Cu can be produced by aerosol pyrolysis of copper nitrate solutions by suitably selecting furnace ambients and operating temperatures. Thus, pyrolysis in nitrogen at 1200° C. yields $Cu_2O$; pyrolysis in nitrogen at 700° C. yields CuO; and pyrolysis of comparable source solutions in 7% $H_2$ in $N_2$ at 700° C. yields metallic Cu. By properly choosing source materials, ambient gas and reaction energetics, one can form multi-phase, mixed-metal materials by selecting a pyrolysis process that causes the metal reactants to reach specific degrees of oxidation. For example, a dilute aqueous solution of equal parts copper nitrate and indium nitrate will form single-phase $Cu_2In_2O_5$ when pyrolyzed at about 900° C. in $O_2$, multi-phase $Cu_2O$—$In_2O_3$ when pyrolyzed at about 900° C. in $N_2$, and multi-phase Cu—$In_2O_3$ when pyrolyzed at about 500° C. in 10 vol % $H_2$ in $N_2$. Similar results are possible using other source materials such as molten metal droplets and metal vapors. Different mixed metal groupings such as Zn—Al, In—Sn, etc. will yield single-phase oxides, multi-phase oxides, metal-metal oxide composites, or mixed-metal metallic particles depending on the relative reaction rates and oxidation rates of different metal-containing reactants in the temperature, time and ambient gas characteristics of the reaction environment.

The advantages of this first aspect of the invention are realizable on a wide variety of materials. For example, particulate materials that can be advantageously processed this way include oxide, chalcogenide, metal and hybrid materials such as $Cu_2In_2O_5$, Cu—In—Se, Cu—In and $Cu_2Se$—$In_2O_3$ useful as particulate precursors for forming $CuInSe_2$ and its alloys. Other particulate materials can also be processed according to this embodiment; for example, $In_xO$—$Sn_xO$ materials for forming indium tin oxide (ITO), Zn—Al materials for forming Al-doped ZnO, ZnO—CdO materials for forming $Zn_xCd_yTe$, and $Zn_xP_yO$—ZnO materials for forming $Zn_xP$. These advantages of this first aspect is particularly evident in Group IIB mixed-metal materials such as ZnO—CdO, Groups IB and IIIB mixed-metal materials such as $Cu_2In_2O_5$, and Groups IIIB and IVB mixed-metal materials such as ITO.

A second aspect of the invention is the use of slurry spraying and meniscus coating methods to deposit particulate layers as precursors for forming thin films.

Particulate precursor layers provide key advantages over solid precursor layers. Solid precursor layers, such as layers of Cu—In and other metal alloys, are subject to inhomogeneities due to phase segregation, e.g. segregation into liquid In and solid Cu-rich $Cu_xIn_y$ phases, at temperatures typically used to convert Cu—In alloys to $CuInSe_2$ using such conversion pathways as annealing in Se vapor. In contrast, particulate precursors limit the impact of phase segregation by physically constraining a particle's constituents to the dimensions of the particle.

Mixed-metal particles can also improve final composition uniformity control by decoupling sequential constituent addition uniformity from final materials uniformity. For example, in contrast to sputtered or vacuum evaporated Cu and In precursor layers typically used for preparing $CuInSe_2$ films, which layers generally exhibit spatial variations in Cu/In composition, particulate precursors uniformly containing Cu and In in the desired atomic ratio can preserve the desired $CuInSe_2$ composition, even when $CuInSe_2$ film thickness varies due to precursor layer deposition inhomogeneities.

Some of the advantages of particulate, mixed-metal precursors, notably, ease of thin film deposition, can be achieved by using particulates that are substantially composed of the desired final material. However, particles composed of the desired final material often yield inferior film quality. For example, $CuInSe_2$ particles can be used to form a $CuInSe_2$ solid or film, but, without effective fluxing (such as by $CdCl_2$ in CdTe) or special materials formation pathways (such as lower effective melting temperatures for nanoparticles of very small diameters (e.g., 20 nanometers or less)), particulate precursors of the desired final composition, or mixtures of stable compounds of the constituent elements, such as mixtures of $Cu_2Se$ and $In_2Se_3$, generally result in final materials with poor cohesion, low density and inferior electronic properties. In contrast, precursors that undergo chemical and/or structural conversions, such as metallic Cu—In precursors subsequently converted to $CuInSe_2$ (with an accompanying 2 to 3 times volume expansion), are more likely to yield cohesive, dense $CuInSe_2$ materials than would comparably processed binary or ternary selenide precursors.

One can also mitigate precursor phase segregation and provide for cohesion and densification by using phase-stabilized precursor materials such as oxides and other compounds. Solid metal oxide precursors such as $Cu_2O$, $In_2O_3$, $Cu_2In_2O_5$ and alloys of these with other compounds are useful in that such oxide phases are more stable against phase segregation at temperatures of 150–700° C. typically used to convert precursor materials to chalcogenide materials; but solid metal oxide films are difficult to deposit at high rates on large areas. Particulate precursors comprising a metal oxide phase are particularly advantageous in comprising phase-stabilized precursors and in providing for easy and efficient deposition in film form by such low-cost techniques as spraying and printing.

Particulate precursor layers can be deposited by numerous methods. For example, screen printing is widely used to deposit Ag-paste grid lines on silicon solar cells, and screen printing is used to deposit CdTe pastes to fabricate large-area, thin-film solar cells. Stencil printing, writing and nozzle printing have been used to deposit narrow grid lines of particle-based pastes, and writing and nozzle printing techniques have been used for depositing CdTe layers on large-area substrates. While screen printing, stencil printing, writing and nozzle printing techniques are usable for applications where layer thickness is not critical, such techniques are typically limited to minimum layer thicknesses of 5 to 10 microns. These minimum practical layer thicknesses are substantially larger than the 1 to 2 micron thicknesses typically optimal for thin-film photovoltaics applications, thus these techniques are relatively materials-intensive and costly.

Slurry spraying and meniscus coating methods are advantageous in providing fast, uniform deposition of very thin layers, and the use of such methods to form precursor layers for thin-film photovoltaic films for solar cells is the second aspect of the invention. Slurry spraying methods, such as pneumatic spraying with a pressurized gas nozzle, hydraulic spraying with a pressurized slurry expelled from through an orifice, ultrasonic spraying with rapidly vibrating atomization surface and electrostatic spraying with a high-voltage electric field to direct the atomized slurry to the part, and meniscus coating methods, such as dip coating in a bath or Langmuir trough, spin coating on a rotating stage, waterfall coating in which the substrate travels through a cascading sheet of slurry, and in-line meniscus coating in which the substrate contacts a slurry pool, are useful for depositing thin, uniform layers of particulate materials on large-area substrates. Such methods are in general not limited by the particle delivery fixturing, such as screen and emulsion thicknesses as in the case of screen printing.

Slurry spraying is particularly advantageous in providing a cost-effective method of depositing thin films on large areas with low capital equipment and indirect materials costs. For example, uniform particle layers of less than 1 micron thickness can be deposited by slurry spraying particles with mean sizes of 0.25 micron or less, and the slurry spray can be rastered to uniformly coat large areas. Slurry spraying can achieve a materials use efficiency of more than 90%.

Slurry spraying can accommodate a wide variety of slurry particles, solvents, additives and spraying conditions to achieve advantageous effects. For example, slurry spraying can accommodate a wide variety of particle types, such as single-phase $Cu_2In_2O_5$ oxides, multi-phase $Cu_2O$—$In_2O_3$ oxides, multi-phase Cu—$In_2O_3$ materials, and metallic Cu—In materials.

Slurry spraying can accommodate a wide variety of solvents, such as water, alcohols, glycols, and mixtures of such solvents. Water is particularly advantageous as a safe and simple slurry solvent into which many types of metal and metal oxide particles will adequately disperse.

Slurry spraying can accommodate a wide variety of slurry additives such as dispersants, thickeners, binders and surfactants to optimize layer properties. A 1 to 5 volume percent of an alcohol such as ethanol is a convenient dispersion aid for aqueous slurries containing metal and/or metal oxide particles, as are various commercial dispersants such as Rohm and Haas Duramax 3002, 3007 and 3019.

Slurry spraying can accommodate a wide degree of solids loading and deposition rates. A solids loading of 0.1 to 200 g/L is preferable for slurry spraying of a water-based slurry of sub-micron metal and/or metal oxide particles. A solids loading of 0.5 to 25 g/L is more preferable and of 5 to 10 g/L is most preferable for 0.1 micron mixed-metal particles comprising a metal oxide.

Slurry spraying can be effected in air or in a controlled environment such as an inert or reducing atmosphere that will mitigate particle oxidation.

Slurry spraying can be effected by a variety of means, including for example by entraining the slurry in a gas flow such as in a pneumatic air brush, by atomizing the slurry from a surface such as in an ultrasonic sprayer, or by expelling the pressurized slurry through a hydraulic nozzle. Pneumatic slurry spraying is particularly advantageous for minimizing spray equipment costs and complexity. Ultrasonic slurry spraying is particularly advantageous for minimizing substrate cooling and slurry losses due to gas flow. Electrostatic slurry spraying is particularly advantageous for maximizing materials use efficiency.

The characteristics of slurry-sprayed layers can be affected by substrate surface temperature. In general it is best if the substrate surface temperature is high enough to vaporize the slurry solvent rapidly enough to avoid slurry pooling and low enough to provide for solvent-facilitated lateral movement of particles on the growing layer surface. Excessively low surface temperatures allows solvent build-up and results in macroscopically non-uniform layers. Excessively high surface temperatures results in the solvent evaporating in flight or too quickly on arriving at the substrate surface and yields microscopic clumping of particles and poor microscopic particle coverage. A heater surface temperature of about 100°–150° C. is advantageous for aqueous slurries.

The advantages of this second aspect of the invention are realizable on a wide variety of materials. One embodiment of this second aspect is spraying an aqueous slurry of single-phase $Cu_2In_2O_5$ particles to form phase-stabilized precursor layers for subsequent conversion into $CuInSe_2$. Just as $Cu_2In_2O_5$ particulate layers can be deposited by slurry spraying as precursor layers to form $CuInSe_2$, ZnO—CdO particulate layers can be spray-deposited as precursor layers to form $ZnCdTe_2$, and In—Sn—O particulate layers can be spray-deposited as precursor layers to form ITO.

A third aspect of the invention comprises the formation of bulk or film materials from multi-phase, mixed-metal, particulate precursor materials comprising a metal oxide phase.

Figure 1:
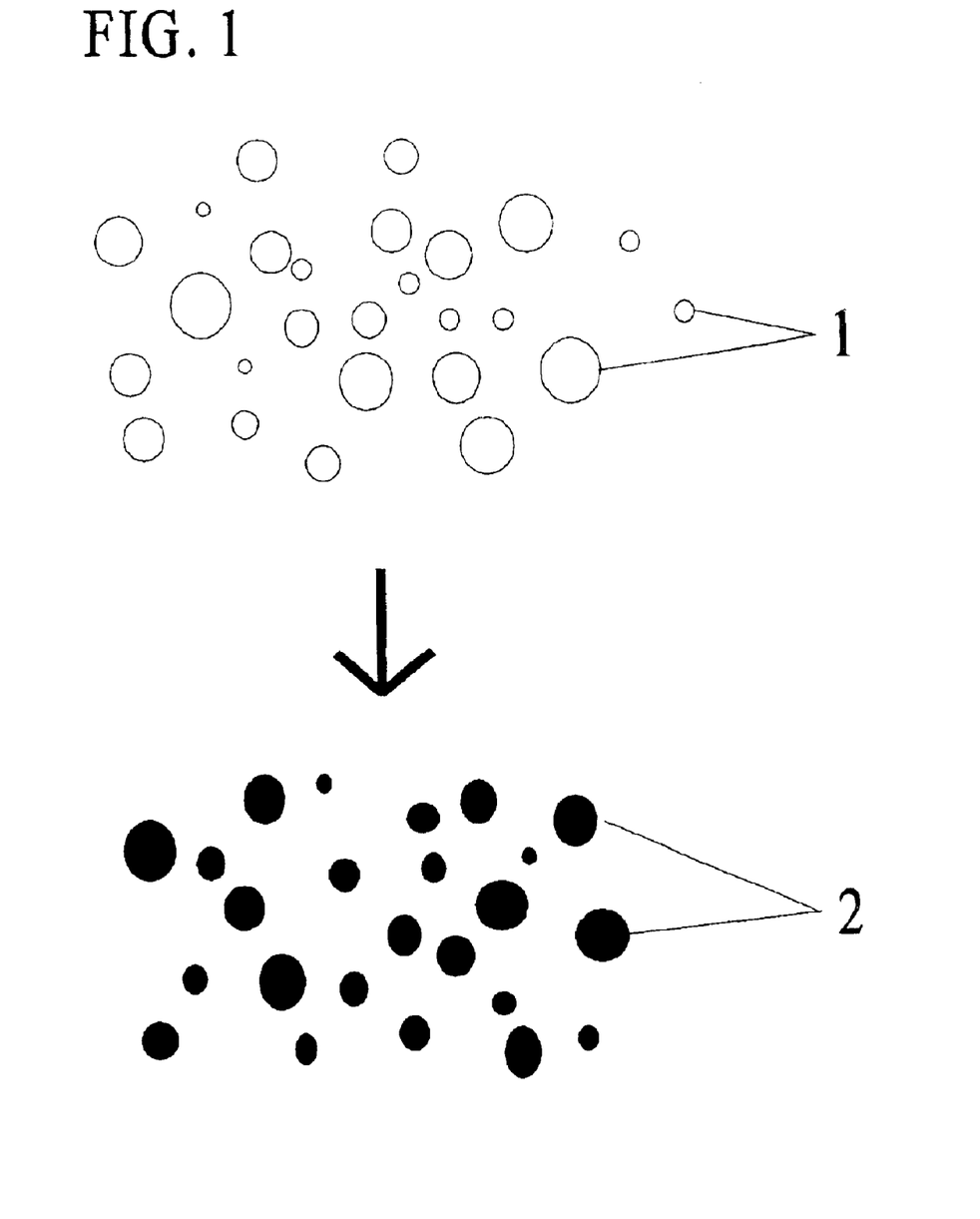
FIG. 1 is a schematic representation of the formation sequence of bulk materials in accordance with one method of the present invention.

Referring to FIG. 1, this third aspect of the invention is schematically depicted as comprising the step of converting one or more particulate precursor materials 1 to desired bulk materials 2, wherein said precursor materials comprise multi-phase, mixed-metal particles comprising a metal oxide.

Figure 2:
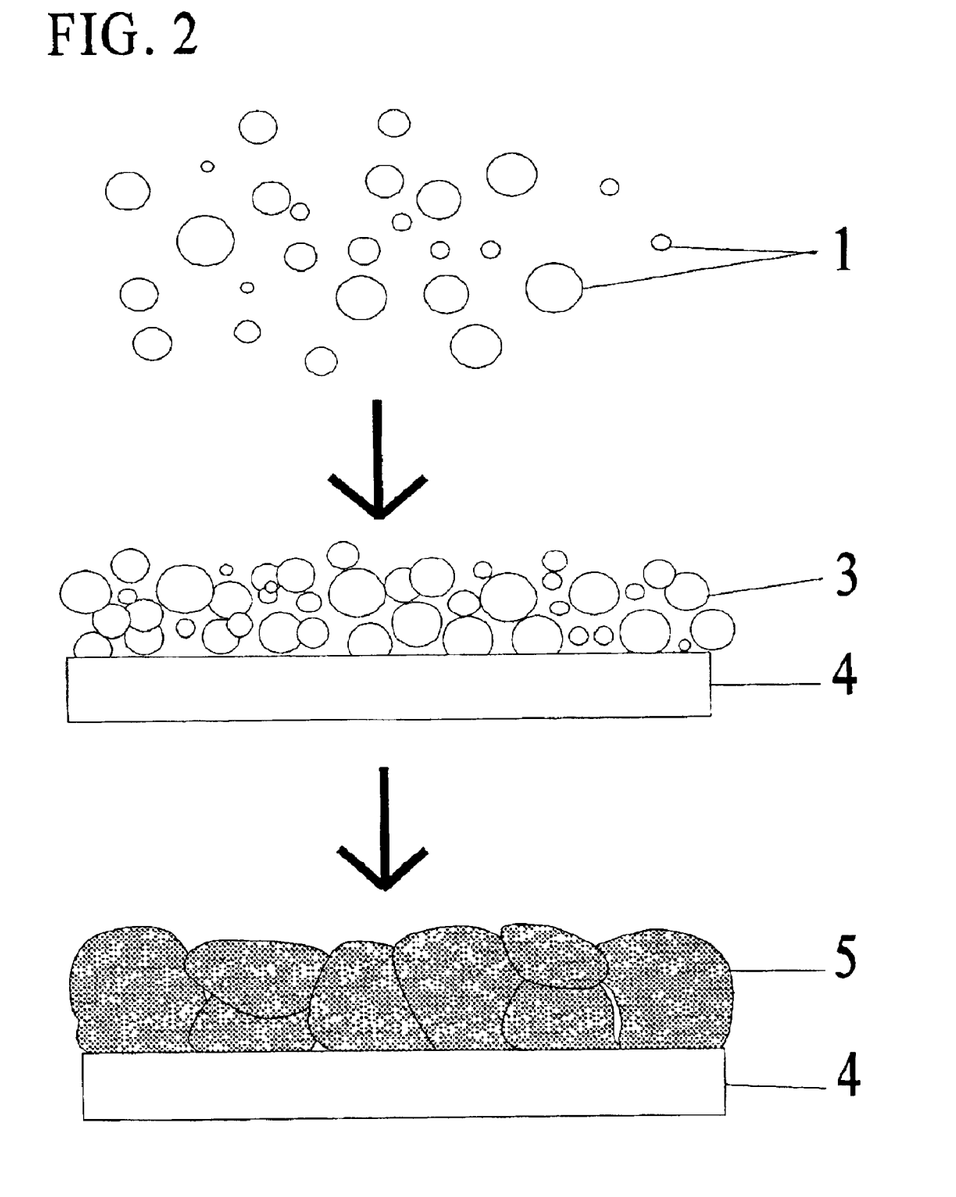
FIGS. 2 and 3 are schematic representations of the formation sequences of films of materials in accordance with alternative methods of the present invention.

Referring to FIG. 2, this third aspect of the invention is further depicted as also comprising the steps of (a) depositing one or more precursor layers 3 on a substrate 4 of one or more particulate precursor materials 1, where the precursor materials comprise multi-phase, mixed-metal particles comprising at least one metal oxide, and (b) converting the precursor layers to one or more desired films 5.

Multi-phase, mixed-metal, particulate precursors comprising a metal oxide phase provide key advantages over solid precursors and single-phase particulate precursors. Fine-grained, single-phase, mixed-metal oxide particulate precursor layers capture many of the advantages of particulate precursor layers comprising oxides, but single-phase particulate precursor layers such as $Cu_2In_2O_5$ converted to films of final materials such as $CuInSe_2$ by such processes as vapor-phase, gas-phase or solid state reactions with one or more chalcogen-containing materials (such as Se vapor, $H_2Se$ or a Se coating) often yield final materials with low densities and poor electronic qualities, presumably as a result of the precursor particles expanding in diameter upon conversion without coalescing or conforming to fill the voids present prior to conversion. The use, instead, of mixtures of constituent single-phase oxide particulates such as $Cu_2O$ and $In_2O_3$ can yield somewhat better film cohesion and density due, presumably, to the differing conversion rates and intermediary properties of the different particulate compositions. However, the physical segregation of constituents in separate particles generally requires that thick films be processed for long times at high temperatures to achieve suitable final film composition uniformity. Thick films waste materials and increase costs, and long, high-temperature processing severely limits the spectrum of suitable substrates and workable solar cell structures.

Multi-phase, mixed-metal, particulate precursors comprising a metal oxide simultaneously provide the advantages of particles, phase-stabilized oxides and multi-material reactions. Thus, two-phase, $Cu_2O$—$In_2O_3$ particles in which each particle has localized regions of $Cu_2O$ and $In_2O_3$ can yield thin, $CuInSe_2$ films comparable in quality to films produced from single-phase $Cu_2In_2O_5$ particles or thicker films produced from mixtures of single-phase binary oxide particles processed for longer times at higher temperatures. Similarly, while both multi-phase $Cu_2O$—$In_2O_3$ and single-phase $Cu_2In_2O_5$ particulate precursor layers can yield homogeneous $CuInSe_2$ films when reacted with selenium vapor under suitable conditions, $CuInSe_2$ films prepared from multi-phase precursors exhibit larger grains and higher densities than do $CuInSe_2$ films prepared from single-phase precursors using comparable selenization conditions.

The multiple phases of a multi-phase precursor particle can be segregated in any fashion within a particle. For example, phases can be macroscopically segregated within a two-phase particle, as in such idealized cases as where two phases constitute separate hemispheres of a two-phase spherical particle or where one phase forms a concentric shell around a spherical subparticle of the other phase.

Embodiments where one or more phases substantially envelop other phases are particularly advantageous when the outer phases exhibit differing conversion rates and intermediary properties that facilitate improved final material properties. For example, given that a liquid $CuxSe$ phase within a $CuInSe_2$ film can act as a flux to promote grain growth, a precursor comprising $Cu_2O$—$In_2O_3$ multi-phase particles of $Cu_2O$ around a subparticle core of $In_2O_3$ should yield the transitory existence of $Cu_xSe$ acting to promote particulate layer cohesion and densification during conversion to the selenide, even for $Cu_2O$—$In_2O_3$ multi-phase particles that are In-rich overall.

The advantages of multi-phase, particulate precursors containing a metal oxide can also to be realized with mixtures of such precursors with other particulate materials. For example, multi-phase, particulate precursors comprising multiple oxide phases such as $Cu_2O$—$In_2O_3$ can be mixed with other particulates, such as Cu, $Cu_xO$, $Cu_xSe$ and Se particulates, to facilitate densification and grain growth through fluxing. Such mixtures of particulate precursors can be effected by mechanical mixing of precursor materials before deposition, by co-depositing the multiple precursor materials, or by sequentially depositing the different precursor materials.

The advantages of multi-phase particulate precursors containing a metal oxide can also be realized by combining such precursors with other precursor materials. For example, layers of multi-phase, particulate precursors comprising metal oxide phases, such as In-rich $Cu_2O$—$In_2O_3$, can be combined with solid layers of Cu or other metal deposited by physical vapor deposition, solution deposition, and other techniques as known in the art; such composite precursors combining multi-phase, particulate layers and other layers facilitate advantageous reaction pathways, such as $Cu_xSe$ fluxing.

The advantages of this third aspect are realizable on a wide variety of materials. Compound materials that can be processed this way include photovoltaic materials such as $CuInSe_2$ and its alloys with Ga and S, transparent conductors such as indium tin oxide (ITO), ZnO and ZnO:Al, optoelectronic materials such as $Zn_xCd_yTe$ and $Hg_xCd_yTe$, and semiconductor materials such as $Al_xGa_yAs$ and $Zn_xP$.

For example, just as $Cu_2O$—$In_2O_3$ multi-phase, particulate precursors are advantageous for forming $CuInSe_2$, so, too, will $In_2O_3$—$SnO_2$, ZnO—CdO and $AlO_y$—$GaO_x$ particulate precursors be advantageous for forming ITO, $Zn_xCd_yTe$ and $Al_xGa_yAs$, respectively. Similarly, just as $Cu_2O$-coated $In_2O_3$ and $In_2O_3$-coated $Cu_2O$ particles would be advantageous for forming $CuInSe_2$, ZnO-coated CdO particles would be advantageous for forming $Zn_xCd_yTe$. And just as mixtures of $Cu_2O$—$In_2O_3$ and Cu particles may yield benefits in forming $CuInSe_2$, mixtures of ZnO—CdO and Zn particles may yield benefits in forming $Zn_xCd_yTe$.

A fourth aspect of the invention is the formation of bulk or film materials from multi-phase, mixed-metal, particulate precursor materials comprising both a metal oxide phase and a non-oxide phase.

Referring again to FIG. 1, a first step of this aspect of the invention is schematically depicted as the converting of one or more particulate precursor materials 1 to desired bulk materials 2, wherein the precursor materials comprise multi-phase, mixed-metal particles comprising a metal oxide phase and a non-oxide phase.

Referring again to FIG. 2, this fourth aspect of the invention is schematically depicted as the steps of (a) depositing one or more precursor layers 3 on a substrate 4 of one or more particulate precursor materials 1, where the precursor materials comprise multi-phase, mixed-metal particles comprising both metal oxide and non-oxide phases, and (b) converting the precursor layers to one or more desired films 5.

Multi-phase, mixed-metal, particulate precursors containing both oxide and metal phases provide particular advantages. For example, Cu—$In_2O_3$ particulate precursors in which the particles comprise a metallic Cu phase and an $In_2O_3$ oxide phase yield differential grain growth, presumably due to $Cu_xSe$ fluxing, given the differential rate of selenization of metallic copper versus the ion exchange conversion of indium oxide to indium selenide, and the solid state diffusion of the binary compounds to form the ternary selenide. As another representative example, $Cu_2In_2O_5$—Se multi-phase, particulate precursors incorporate additional constituents into the precursor, simplifying subsequent conversion to the desired final material. Again, separate phases can be segregated in any fashion, with the substantially enveloped structures providing particular advantages.

Multi-phase, mixed-metal, particulate precursors containing both oxide and non-oxide compound phases can also provide other significant advantages. For example, $Cu_xSe$—$In_2O_3$ particulate precursors provide a direct pathway to $Cu_xSe$ fluxing. Again, separate phases can be segregated in any fashion, with the substantially enveloped structures providing particular advantages.

As with precursors comprising multi-phase, mixed-metal, particulate materials comprising only metal oxide phases, additional advantages accrue with mixtures of particles and with composites with other precursor materials. For example, In-rich $Cu$—$In_2O_3$ particles mixed with Cu and/or Se particles, and layers of $Cu$—$In_2O_3$ particles combined with layers of Se, facilitate $Cu_xSe$ fluxing and/or simple solid state reactions.

The advantages of this fourth aspect of the invention are realizable on a wide variety of materials. For example, just as $Cu$—$In_2O_3$ multi-phase, particulate precursors are advantageous for forming $CuInSe_2$, so, will too, In—$SnO_2$, Zn—CdO and Zn—$Al_2O_3$ particulate precursors be used advantageously to form ITO, $Zn_xCd_yTe$ and Al-doped ZnO, respectively. Similarly, just as $Cu_xSe$—$In_2O_3$ particles are advantageous for forming $CuInSe_2$, ZnO—CdS and ZnO—CdSe particles will be advantageous for forming $Zn_xCd_yS$ and $Zn_xCd_ySe$, respectively. Just as Cu-coated $In_2O_3$ particles would be advantageous for forming $CuInSe_2$, Zn-coated CdO particles would be advantageous for forming $Zn_xCd_yTe$. And just as mixtures of $Cu$—$In_2O_3$ and Cu particles will yield benefits in forming $CuInSe_2$, mixtures of Zn—$Al_2O_3$ and Zn particles will yield benefits in forming Al-doped ZnO and mixtures of Zn—$P_2O_5$ and Zn particles will yield benefits in forming $Zn_xP$.

A fifth aspect of the invention is the formation of bulk and film materials from multinary, particulate, metallic precursor materials and mixtures of such materials.

Referring again to FIG. 1, this aspect of the invention comprises, initially, converting one or more precursor materials 1 to desired bulk materials 2, wherein the precursor materials are multinary, particulate, metallic precursor materials or mixtures of such materials.

Referring again to FIG. 2, this aspect of the invention comprises the steps of (a) depositing one or more precursor layers 3 on a substrate 4 of one or more particulate precursor materials 1, where the precursor materials are multinary, particulate, metallic precursor materials or mixtures of such materials, and (b) converting the precursor layers to one or more desired films 5.

Multinary, particulate, metal precursor materials provide key advantages over solid metal precursors and solid layered metal precursors. Multinary particles improve final composition uniformity control by decoupling sequential constituent uniformity from final materials uniformity. Metal precursor particles are more likely to yield cohesive, dense final materials than would comparably processed particles of the final desired material. By physically constraining a particle's constituents to the dimensions of the particle, particulate precursors limit the impacts of phase segregation common in solid metal precursors.

Multinary, particulate, metal precursor materials can be single-phase or multi-phase materials. For example, Group I and III metals can form single-phase alloys, such as $Cu_{11}In_9$, and multi-phase materials, such as regions of pure In within a Cu-rich, Cu—In alloy bulk mass. The multiple phases of a multi-phase, metal precursor can themselves be elemental metals or metal alloys; multi-phase materials include, for example, elemental phases of Cu, In and Se, and alloy phases of Cu—In, Cu—Ga, etc.

The multiple phases of multi-phase, multinary, particulate metal precursor materials can be segregated in any fashion within a particle, including, for example, macroscopically segregated within a particle or as a substantially enveloping coating of one or more phases around inner subparticles of other phases. A particularly preferred case is where one or more phases substantially envelop other phases, for example, Cu on an In subparticle.

Precursor layers of multinary, metal particles can be formed by directly depositing multinary metal particulates by, for example, slurry spraying. Conversely, layers of multinary oxide particles can be deposited and subsequently reduced by, for example, annealing in a reducing environment (such as a hydrogen atmosphere) to form multinary, metal particulate layers.

As with precursors comprising multi-phase, particulate materials comprising metal oxide phases, additional advantages accrue with mixtures of particles and with composites with other precursor materials. For example, In-rich, Cu—In particles mixed with Cu and/or Se particles, and layers of Cu—In particles combined with layers of Se, facilitate $Cu_xSe$ fluxing and/or simple solid state reactions.

The advantages of this fifth aspect of the invention are realizable on a wide variety of materials. For example, just as Cu—In multinary, metal particles are advantageous for forming $CuInSe_2$, so, too, In—Sn, Zn—Cd and Zn—Al particles would be advantageous for forming ITO, $Zn_xCd_yTe$, and Al-doped ZnO, respectively. Similarly, just as In—$Cu_{11}In_9$ particles will be advantageous for forming $CuInSe_2$, comparable, multi-phase, mixed-metal composites will be advantageous for other materials. Just as Cu—In particles admixed with Se particles or overcoated with Se will be advantageous for forming $CuInSe_2$, Zn—Cd particles admixed with Te particles or overcoated with Te will be advantageous for forming $Zn_xCd_yS$.

A sixth aspect of the invention is the formation of films from one or more porous precursor layers intercalated with one or more materials. By porous we mean a layer containing void space, such as a layer of particles. By intercalated we mean that the intercalating material partially or substantially fills the voids in the porous layer, such as between the individual particles of a particulate layer. Intercalation is distinct from and distinctly advantageous relative to overcoating, as overcoating generally does not fill the voids with the overcoated material. For example, a Cu—In precursor layer can be overcoated with Se by screen printing, without the Se penetrating into the voids, if any, in the Cu—In precursor layer. This phenomenon is well-known and is used to great advantage in screen printing electrodes on porous and/or pinhole-ridden films where a penetrating overcoating would electrically short-circuit the film. Intercalation purposely seeks to fill the voids, partially or substantially. Another advantage of intercalation is that it facilitates densification and cohesion of films formed from particle-based precursor layers.

Figure 3:
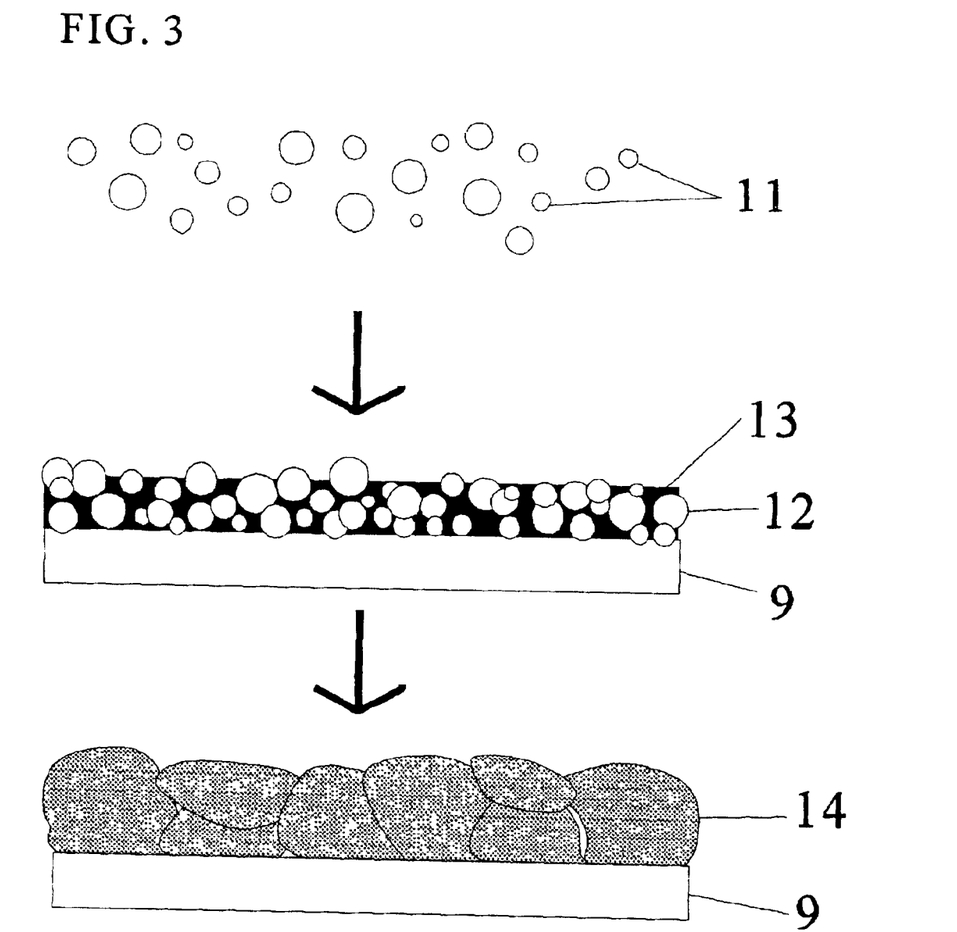

Referring to FIG. 3, this aspect of the invention comprises depositing one or more precursor layers 12 of one or more porous precursor materials 11 on substrate 9, intercalating the precursor layers with one or more materials 13, and converting said precursor layers to desired films 14.

Intercalated porous precursor layers offer significant advantages over solid precursor layers and unintercalated porous precursor layers. Solid precursor layers, such as Cu—In or layered Cu/In, can be overcoated with reactants, such as Se, to facilitate solid state reactions at temperatures lower than those typically required for vapor-phase or gas-phase reactions. Intercalated particulate precursor layers can provide similar advantages while also providing easier layer deposition and suppressing phase segregation. Unintercalated porous precursor layers can provide the advantages detailed above in the discussion of the second, third, fourth and fifth aspects of the invention; intercalated porous precursor layers provide additional advantages, including low-temperature conversion and better densification.

Porous precursor layers can be intercalated with one or more materials that provide advantageous processing pathways and/or that provide constituents necessary to form the desired final film composition. The final desired film may be formed by reaction solely between the porous precursor layer and the intercalating materials, or between the intercalated precursor and additional reactants. For example, an oxide precursor layer, such as $Cu_2In_2O_5$, can be intercalated with a metal chalcogen, such as Se, to facilitate a solid state reaction and form a chalcogenide, such as $CuInSe_2$. As another example, In-rich $Cu_2In_2O_5$ can be intercalated with a copper-containing material, such as Cu, $Cu_2O$, or $Cu_2Se$, to facilitate $Cu_xSe$ fluxing during conversion to $CuInSe_2$ by reaction with Se vapor. As another example, $In_2O_3$ can be intercalated with tin or tin oxide, or, conversely, $SnO_2$ can be intercalated with indium or indium oxide, to facilitate the formation of an indium tin oxide transparent conductor film. Similarly, a particulate layer of ZnO—CdO can be intercalated with Cd, CdO or CdS to facilitate formation of $Zn_xCd_{1-x}S$.

Porous precursor layers can be intercalated at any time during or after the deposition of the layers. For example, an In-rich $Cu_2In_2O_5$ particulate layer can be intercalated with $Cu_xO$ during deposition of the particulate layer, by hybrid spraying processes in which copper salts are dissolved in an aqueous slurry containing In-rich $Cu_2In_2O_5$, such that spraying onto a heated substrates, in an oxidizing environments simultaneously deposits a layer of $Cu_2In_2O_5$ intercalated with $Cu_xO$. As another example, In-rich $Cu_2In_2O_5$ can be intercalated with Cu after deposition of the particulate layer, by solution deposition of Cu into the $Cu_2In_2O_5$ layer.

A film can be formed by interdiffusing the constituents of intercalated porous layers or a mixture of intercalated and unintercalated layers. For example, $CuInSe_2$ can be formed by annealing $Cu_2In_2O_5$ intercalated with Se in a reducing atmosphere so as to cause an ion exchange reaction between oxygen and selenium. Alternatively, intercalated layers can be reacted with additional reactants. For example, In-rich $Cu_2In_2O_5$ particulate layers intercalated with Cu can be reacted with Se vapor or an overcoated Se layer to form $CuInSe_2$, and a layer of In-rich $Cu_2In_2O_5$ particles admixed with Se particles and intercalated with Cu can be interdiffused to form $CuInSe_2$.

The advantages of this sixth aspect of the invention are realizable on a wide variety of materials. For example, just as In-rich $Cu_2In_2O_5$ particulate layers intercalated with Cu can be reacted with Se vapor to form $CuInSe_2$, Zn-rich ZnO—CdO particulate layers intercalated with Cd can be reacted with Te vapor to form $ZnCdTe_2$.

Certain features of this invention apply to all of the aspects and embodiments described herein. For example, suitable particulate precursor materials as described in the preferred embodiments of this invention can vary in size and shape with precursor form, function and composition. Particulate precursors intended for bulk materials preparation can be of any size, preferably of 1 mm diameter or less, more preferably of 0.1 mm or less. Particulate precursors intended for forming 10–100 $\mu$m thick films useful for phosphor coatings, acoustic surface wave devices, photodetectors, optical filters, electroluminescent devices and related applications can be of any size less than the desired film thickness, preferably of 5 $\mu$m diameter or less, more preferably of 1 $\mu$m diameter or less. Particulate precursors intended for forming 0.5–10 $\mu$m thick films useful for thin-film photovoltaics and related applications can be of any size less than the desired film thickness, preferably of 1 $\mu$m or less, more preferably of 0.5 $\mu$m or less, most preferably of 0.1 $\mu$m or less. Particulate precursor materials of average size less than the ranges specified here may provide equivalent or enhanced results; for example precursor particles of 0.1 $\mu$m or less may be used for bulk materials, thick film and thin film applications to advantageous effect.

Particulate precursor materials can be of uniform size, of a broad distribution of sizes, or of specific narrow distributions of sizes. For example, a bulk or thin film material may best be formed by a collection or layer, respectively, of uniformly-sized precursor particles; a thin film material may achieve improved packing density and hence, film density and cohesion, by being formed from a mixture of particulate materials with a range of sizes; and a thin film material may achieve optimal film properties by a specific distribution of sizes, such as a bimodal distribution of relatively larger, multinary oxide particles mixed with relatively smaller, metal particles.

Particulate precursor particle shape and form can vary with precursor material and preparation method. For example, precursor particles can be spheres, pieces of spheres, plates irregular solids, and other shapes as may result from various particle formation reactions; and precursor particles can be solid, hollow, spongy, and other forms as may result from various particle formation reactions. Substantially solid, substantially spherical particles are particularly advantageous for achieving densely-packed precursor layers.

Particulate precursor layers can be deposited by numerous methods, including slurry spraying, spray printing, spin coating, meniscus coating, slurry painting, slurry casting, screen printing, stencil printing, writing, nozzle printing, relief printing, intaglio printing, and other such processes as known in the art. Any of these methods is useful to realize the primary advantages of the particulate materials processes disclosed in the third, fourth, fifth and sixth aspects of the invention. Slurry spraying and meniscus coating methods provide unique additional advantages for forming high-quality thin films.

Conversion of precursor layers to desired final films as described in the preferred embodiments of this invention can be effected by numerous methods, including solid-state, vapor-phase, gas-phase and hybrid reactions in, for example, batch or in-line furnaces; liquid-phase reactions in, for example, ion exchange baths; and other such methods and equipment as known in the art. Thermal annealing in a reducing environment is particularly advantageous in providing a simple technique to effect ion exchange and interdiffusion reactions to convert particulate precursors to the desired materials. Temperature and time profiles necessary to cause ion exchange and/or interdiffusion vary with the particular materials being exchanged and/or interdiffused. Typical gas-solid reactions to form $CuInSe_2$ include a reaction period at approximately 150° C. and a high-temperature anneal at approximately 400° C. Solid-state reactions occur at lower temperatures, e.g. about 50°–75° C. lower than typical gas-solid reactions. Vapor-phase reactions can occur at low precursor temperatures, provided that a stable source of reactant vapor is present, e.g., in a vacuum evaporation system. Reactions with wider-bandgap alloys of $CuInSe_2$ with Ga and S generally require higher reaction and annealing temperatures, e.g. about 50°–150° C. higher than typical $CuInSe_2$ reactions. Reactions with oxide-containing precursors generally require higher temperatures than reactions with metal precursors.

Reactants from Group VB, such as P, As, Sb and Bi, and from Group VIB, such as O, S Se and Te, can be present in solid, liquid, vaporous or gaseous forms. For example, $Cu_2O$—$In_2O_3$ can be reacted with Se to form $CuInSe_2$, with Se being present as a solid, such as admixed Se particles, or an overcoated solid or particulate Se layer; as a liquid, such as Se-containing ions in solution; as a vapor, such as Se vapor; or as a gas, such as $H_2Se$.

Conversion of particulate precursors in powder or layer form to desired final bulk or film materials as described in the preferred embodiments of this invention can be effected by reactions in various environments, including inert atmospheres such as Ar and $N_2$; reducing atmospheres, such as $H_2$ and gas mixtures containing $H_2$; reactive gas atmospheres, such as atmospheres comprising hydride gases such $H_2S$ and $H_2Se$; reactive vapor atmospheres, such as atmospheres comprising one or more metal vapors such as $Se_{vap}$, $S_{vap}$ and $Te_{vap}$ and such as atmospheres comprising compound vapors such as $In_xSe$; reactive liquids; and other such environments as known in the art. Reactive reducing atmospheres comprising a reactive vapor and hydrogen gas are particularly advantageous.

Conversion of particulate precursors to desired final bulk materials as described in the preferred embodiments of this invention can be effected by numerous methods, including vapor-phase and gas-phase reactions in, for example, fluidized bed reactors or calciners; liquid-phase reactions in, for example, stirred reactors; and other such methods as known in the art.

Suitable substrates onto which to deposit precursor layers as described in the preferred embodiments of this invention include any substrate type suitable for the specific application of the final film, including glass, glass coated with substantially transparent conductors such as tin oxide, indium tin oxide and zinc oxide, glass coated with metals such as molybdenum, titanium and tantalum, glass coated with conductive compounds, glass coated with alkali ion diffusion barrier layers, low-Na glasses, ceramics, metal sheets and foils, polymers, and other such substrates known in the art. Particularly useful are substrates like conductor-coated glass, especially glass coated with molybdenum or conductive metal oxides.

Conversion of precursor layers to desired final films as described in the preferred embodiments of this invention can be effected by numerous methods, including solid-state, vapor-phase, gas-phase and hybrid reactions in, for example, batch or in-line furnaces; liquid-phase reactions in, for example, ion exchange baths; and other such methods and equipment as known in the art. Intercalation of particulate precursor layers as described in the preferred embodiments of this invention can be effected by numerous methods, including spray pyrolysis and hybrid slurry/pyrolysis spraying; solution or chemical bath deposition, electroplating; vapor-phase deposition at precursor layer temperatures below those where substantial reaction between the precursor layer and the vapor occurs; and other such methods as known in the art.

The following nonlimiting examples are illustrative of the invention.

EXAMPLE 1

Single-phase, mixed-metal, $Cu_2In_2O_5$ particulate materials with an average particle diameter of about 0.1 µm were prepared by atomizing an aqueous solution containing 0.25 mM each of copper nitrate and indium nitrate in an ultrasonic nebulizer to form a fine aerosol; transporting the aerosol into a quartz tube furnace operated at about 900° C. using oxygen as a carrier gas; and capturing the resulting oxide particulates on a filter membrane at the exit of the furnace.

Particulate average particle diameter is determined by solution concentration and aerosol droplet size; for example, particle diameters of about 0.05 to 0.5 µm are formed from ca 5 µm droplets by varying the concentration of nitrates in the precursor solution from about 0.015 to 15 milli-Molar. Particulate Cu/In atomic composition ratio is determined for the most part by the relative concentration of nitrates in the precursor solutions; for example, particle Cu/In ratios of about 0.65 to 1.15 result from substantially equivalent Cu/In ratios in precursor solutions.

EXAMPLE 2

Multi-phase, mixed-metal, $Cu_2O$—$In_2O_3$ particulate materials were prepared according to Example 1 except that nitrogen was substituted for oxygen as the carrier gas.

EXAMPLE 3

Multi-phase, mixed-metal, Cu—$In_2O_3$ metallic particulate materials were prepared according to Example 1 except that 10 vol % $H_2$ in $N_2$ was substituted for oxygen and the furnace temperature was about 500° C.

Given that metal oxides can be reduced to metals by annealing in suitably reducing atmospheres, it is evident that particles prepared according to this Example except that higher concentrations of $H_2$ are substituted for 10 vol % $H_2$ in $N_2$ will yield multinary, mixed-metal Cu—In particles.

EXAMPLE 4

Single-phase $Cu_2In_2O_5$ particulate materials with an average particle diameter of about 0.1 µm were prepared according to Example 1. Water-based slurries of about 5 to 10 g/L solids loading were prepared by dispersing particulates in de-ionized water using ultrasonic cavitation. Addition of a few weight percent of ethanol and/or a commercial dispersant such as Rohm and Haas Duramax 3002 aided dispersion for some particulate batches. Precursor layers were deposited by spraying the slurries at 1–2 mL/min onto heated glass substrates using air or nitrogen as the spraying gas. The resulting $Cu_2In_2O_5$ particulate layers were macroscopically uniform, adhesive and cohesive, and were microscopically uniform with good coverage.

EXAMPLE 5

Multi-phase, mixed-metal, $Cu_2O$—$In_2O_3$ particulate materials with an average particle diameter of about 0.1 µm were prepared according to Example 2. Precursor layers were spray-deposited using water-based slurries according to Example 4. Precursor-coated substrates were annealed in Se vapor at about 425° C. for about one hour in a reducing atmosphere of 7 to 10 vol % $H_2$ in $N_2$ to convert the oxide precursor layers to $CuInSe_2$ films. The grain size of the $CuInSe_2$ films was examined by electron microscopy and found to be up to 2.5 times larger than the average particle size of the $Cu_2O$—$In_2O_3$ precursors.

Particulate precursor materials with average particle diameters of 0.06 to 0.5 μm were investigated and found workable, provided that layer thicknesses were at least a few particle diameters.

Slurry solids loadings of about 0.2 to 40 g/L were investigated and found workable, provided that the substrate temperature and spraying rate were adjusted to mitigate liquid pooling on the substrate surface and solvent evaporation in-flight.

Precursor layers were also deposited with ethanol-based and propylene glycol-based slurries in which the water and dispersant additives were substituted for denatured ethanol and propylene glycol, respectively.

Comparable precursor layers were also deposited by a casting process in which the slurry was applied to the substrates and allowed to air dry.

Comparable results were obtained using bare and tin-oxide-coated glass substrates.

Given that metal oxides can be converted to metal chalcogenides by annealing in the presence of one or more chalcogenides, it is evident that such particulate precursors will be converted into sulfides, tellurides, phosphides, arsenides, antimonides, other such compounds, and alloys of these by substituting or adding, respectively, suitable sources of the appropriate reactants during the conversion process.

EXAMPLE 6

Single-phase $Cu_2In_2O_5$ particulate materials with an average particle diameter of about 0.1 μm were prepared according to Example 1. Precursor layers deposited using water-based slurries were prepared according to Example 4 and annealed according to Example 5, yielding $CuInSe_2$ films with $CuInSe_2$ grain sizes of at most 1.3 times the average particle size of the $Cu_2In_2O_5$ precursors. The resulting $CuInSe_2$ films are inferior in density and cohesion relative to comparably processed multi-phase $Cu_2O$—$In_2O_3$ precursors.

EXAMPLE 7

Multi-phase, mixed-metal, Cu—$In_2O_3$ particulate materials with an average particle diameter of about 0.1 μm were prepared according to Example 3. Water-based slurries were prepared according to Example 4, and precursor layers were deposited on Mo-coated glass substrates according to Example 5. The precursor-coated substrates were annealed according to Example 4. The grain size of the $CuInSe_2$ films were examined by electron microscopy and found to be about 2 to 5 times larger than the average particle sizes of the Cu—$In_2O_3$ precursors.

Given that multi-phase Cu—$In_2O_3$ particulate materials yield significantly larger $CuInSe_2$ film grain sizes than single-phase $Cu_2In_2O_5$ and multi-phase $Cu_2O$—$In_2O_3$ particulates, and that multi-phase Cu—In solid layers are reported to yield large $CuInSe_2$ grains, it is evident that multinary metallic Cu—In particulates prepared according to Example 3 will yield large $CuInSe_2$ film grains.

EXAMPLE 8

Single-phase $Cu_2In_{1.5}Ga_{0.5}O_5$ particulate materials with an average particle diameter of about 0.1 μm were prepared according to Example 1, except gallium nitrate was substituted for a portion of the indium nitrate. Water-based slurries of $Cu_2In_{1.5}Ga_{0.5}O_5$ particulate materials were prepared according to Example 4. Precursor layer deposition was carried out according to Example 4, and annealing was carried out according to Example 5, yielding $CuIn_{0.75}Ga_{0.25}Se_2$ films. Other desirable constituents, such as alloying metals—for example Al and Ag—in the $CuInSe_2$ alloy materials family, and dopant and additive materials—for example Na, Cd, Zn, P and As—in the $CuInSe_2$ alloy materials family, can be incorporated in the desired concentration in a like manner, Given that alloy constituents, dopants and additive materials can be incorporated into particulate materials by adding sources of the respective alloy constituents, dopants and additive materials to the source solutions to be atomized, it is evident that multi-phase, mixed-metal particles comprising multiple metal oxide phases or both a metal oxide and a non-oxide phase can be prepared with various alloy constituents, dopants and additive materials by adding the appropriate sources of the alloy constituents, dopants and/or additive materials to source solutions prepared and processed according to Examples 2 and 3, respectively. Likewise, it is evident that multinary metallic particles with various alloy constituents, dopants and additive materials can be prepared by appropriately adding to the solutions processed according to Example 3.

EXAMPLE 9

Water-based slurries of about 0.5 μm $Cu_xO$ particulate materials where x~1 were prepared according to Example 4, and dilute copper nitrate solutions were added to the slurries. Precursor layers of $Cu_xO$ intercalated with $Cu_yO$ where y~1 were deposited by spraying these slurry solutions onto heated substrates so as to deposit particles by slurry spraying, and simultaneously by co-depositing $Cu_yO$ by spray pyrolysis so as to partially intercalate the particles. Hybrid slurry/pyrolysis spray deposition of a comparable solution in a suitably reducing atmosphere will yield oxide particles intercalated with Cu metal.

EXAMPLE 10

Water-based slurries of about 0.25 μm $Cu_2In_2O_5$ particulate materials were prepared according to Example 4, and dilute copper nitrate solutions were added to the slurries. Precursor layers of $Cu_2In_2O_5$ intercalated with $Cu_xO$ where x~1 were deposited by spraying these slurry solutions onto heated substrates so as to deposit particles by slurry spraying, and simultaneously by co-depositing $Cu_xO$ by spray pyrolysis so as to partially intercalate the particles.

Although this invention is described with respect to a set of preferred aspects and embodiments, modifications thereto will be apparent to those skilled in the art. Therefore the scope of the invention is to be determined by reference to the claims which follow. Throughout the text and the claims, use of the word "about" in relation to a range of numbers is intended to modify both the low and the high values stated.

What is claimed is:

1. A method for making single-phase mixed-metal oxide particles with an average diameter of less than about 1 micron useful for fabricating thin-film photovoltaic devices, comprising:

preparing a solution comprising Cu and In and/or Ga as metal-containing compounds;

forming droplets of the solution; and heating the droplets in an oxidizing atmosphere to pyrolyze the contents of the droplets to form single-phase copper indium oxide, copper gallium oxide or copper indium gallium oxide particles.

2. A method according to claim 1, wherein the particles comprise Cu, In and Ga.

3. A method according to claim 1, wherein said atmosphere comprises oxygen.

4. A method for making mixed-metal particles with an average diameter of less than about 1 micron useful for fabricating thin-film photovoltaic devices, comprising:

preparing a solution comprising Cu and In and/or Ga as metal-containing compounds;

forming droplets of the solution; and heating the droplets in a reducing atmosphere to pyrolyze the contents of the droplets to form mixed-metal particles, wherein said mixed-metal particles comprise Cu in a metallic phase and In and/or Ga in an oxide phase.

5. A method according to claim 4, wherein the mixed-metal particles comprise at least one phase substantially enveloping at least one other phase.

6. A method according to claim 4, wherein the droplets are heated at between about 350 and about 1050° C. in a reducing atmosphere.

7. A method according to claim 4, wherein the droplets are heated at about 500° C. in a reducing atmosphere.

8. A method according to claim 4, wherein the atmosphere comprises about 10 volume percent hydrogen.

9. A method for making multi-phase mixed-metal oxide particles with an average diameter of less than about 1 micron useful for fabricating thin-film photovoltaic devices, comprising:

preparing a solution comprising Cu and In and/or Ga as metal-containing compounds;

forming droplets of the solution; and heating the droplets in a substantially inert atmosphere to pyrolyze the contents of the droplets to form mixed-metal particles, wherein said mixed-metal particles comprise multiple metal oxide phases.

10. A method according to claim 9, wherein the mixed-metal particles comprise at least one phase substantially enveloping at least one other phase.

11. A method according to claim 9, wherein said atmosphere comprises nitrogen.

* * * * *